(12) United States Patent
Yamaoka

(10) Patent No.: US 11,516,042 B2
(45) Date of Patent: Nov. 29, 2022

(54) IN-VEHICLE DETECTION SYSTEM AND CONTROL METHOD THEREOF

(71) Applicant: Panasonic Intellectual Property Management Co., Ltd., Osaka (JP)

(72) Inventor: Kunisato Yamaoka, Kyoto (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 813 days.

(21) Appl. No.: 16/504,518

(22) Filed: Jul. 8, 2019

(65) Prior Publication Data

US 2020/0028707 A1    Jan. 23, 2020

(30) Foreign Application Priority Data

Jul. 19, 2018 (JP) ............................. JP2018-135862
Feb. 12, 2019 (JP) ............................. JP2019-022644

(51) Int. Cl.

| G11C 13/00 | (2006.01) |
| H04L 12/40 | (2006.01) |
| G06F 3/06 | (2006.01) |
| G06F 12/02 | (2006.01) |
| G11C 11/16 | (2006.01) |

(52) U.S. Cl.
CPC ............ *H04L 12/40* (2013.01); *G06F 3/0619* (2013.01); *G06F 3/0658* (2013.01); *G06F 3/0688* (2013.01); *G06F 12/0246* (2013.01); *G11C 11/1675* (2013.01); *G11C 11/1693* (2013.01); *G11C 13/0002* (2013.01); *H04L 2012/40215* (2013.01)

(58) Field of Classification Search
CPC ........... H04L 12/40; H04L 2012/40215; H04L 12/40006; G06F 3/0619; G06F 3/0658; G06F 3/0688; G06F 12/0246; G11C 16/10; G11C 16/32; G11C 16/3418; G11C 7/04; G11C 11/1675; G11C 11/1693; G11C 13/0002; G07C 5/0866
USPC .......................................... 365/230.03; 701/1
See application file for complete search history.

(56) References Cited

U.S. PATENT DOCUMENTS 6,087,964 A * 7/2000 Allen ...................... G08G 1/042
340/941
6,629,022 B1 * 9/2003 Gessner ............... G05B 19/042
701/1

(Continued)

FOREIGN PATENT DOCUMENTS

| CN | 1517538 A | 8/2004 |
| CN | 103810110 A | 5/2014 |

(Continued)

OTHER PUBLICATIONS

Chinese Office Action from China National Intellectual Property Administration dated Mar. 31, 2021 for Chinese Patent Application No. 201910646198.3.

*Primary Examiner* — Michael T Tran
(74) *Attorney, Agent, or Firm* — Greenblum & Bernstein, P.L.C.

(57) ABSTRACT

In-vehicle detection system includes nonvolatile memory, a controller (SoC) that reads and writes data from and in nonvolatile memory, and detector that outputs detection information to SoC. SoC changes a control signal of nonvolatile memory in accordance with the output of detector.

18 Claims, 16 Drawing Sheets

(56) References Cited

U.S. PATENT DOCUMENTS

| | | | |
|---|---|---|---|
| 7,529,545 B2* | 5/2009 | Rader | H04R 25/70 455/268 |
| 9,007,831 B2* | 4/2015 | Sakui | G11C 16/10 365/185.11 |
| 9,767,012 B2 | 9/2017 | Walker et al. | |
| 9,786,336 B2 | 10/2017 | Woo et al. | |
| 10,917,441 B2* | 2/2021 | Wakita | H04W 72/0453 |
| 2004/0143695 A1* | 7/2004 | Hashimoto | F02D 41/2496 711/1 |
| 2007/0121235 A1* | 5/2007 | Sai | G11B 5/59666 360/75 |
| 2008/0117663 A1* | 5/2008 | Philipp | G11C 13/0004 365/148 |
| 2008/0125901 A1* | 5/2008 | Fleischer | G06Q 10/08 700/215 |
| 2010/0238052 A1* | 9/2010 | Ito | G07C 5/085 340/988 |
| 2011/0281545 A1* | 11/2011 | Murakami | G08B 25/016 455/404.1 |
| 2014/0136752 A1 | 5/2014 | Terada | |
| 2014/0318244 A1* | 10/2014 | Tsutsumi | G01C 19/5776 73/504.12 |
| 2015/0042410 A1* | 2/2015 | Yoneyama | H03B 5/36 331/158 |
| 2015/0134161 A1* | 5/2015 | Yamazaki | B60W 30/18027 180/65.265 |
| 2015/0154815 A1* | 6/2015 | Hagenbuch | G07C 5/008 701/31.5 |
| 2015/0165890 A1* | 6/2015 | Liang | B60W 10/08 180/65.265 |
| 2016/0307375 A1* | 10/2016 | Toutant | G07C 5/085 |
| 2018/0059970 A1* | 3/2018 | Takazawa | G06F 3/0659 |
| 2018/0088218 A1* | 3/2018 | Kawasaki | G01S 17/04 |
| 2018/0114378 A1* | 4/2018 | Slusar | G07C 5/008 |
| 2018/0181454 A1* | 6/2018 | Lin | G06F 3/0653 |
| 2018/0208136 A1* | 7/2018 | Shibata | G07C 5/008 |
| 2019/0102261 A1* | 4/2019 | Cesaretti | G06F 11/1456 |

FOREIGN PATENT DOCUMENTS

| | | |
|---|---|---|
| CN | 107783730 A | 3/2018 |
| JP | 11-086569 | 3/1999 |
| JP | 11-283384 | 10/1999 |
| JP | 2002-367382 | 12/2002 |
| JP | 2007-072627 | 3/2007 |
| JP | 4739870 B | 8/2011 |
| JP | 2017-091075 | 5/2017 |

* cited by examiner

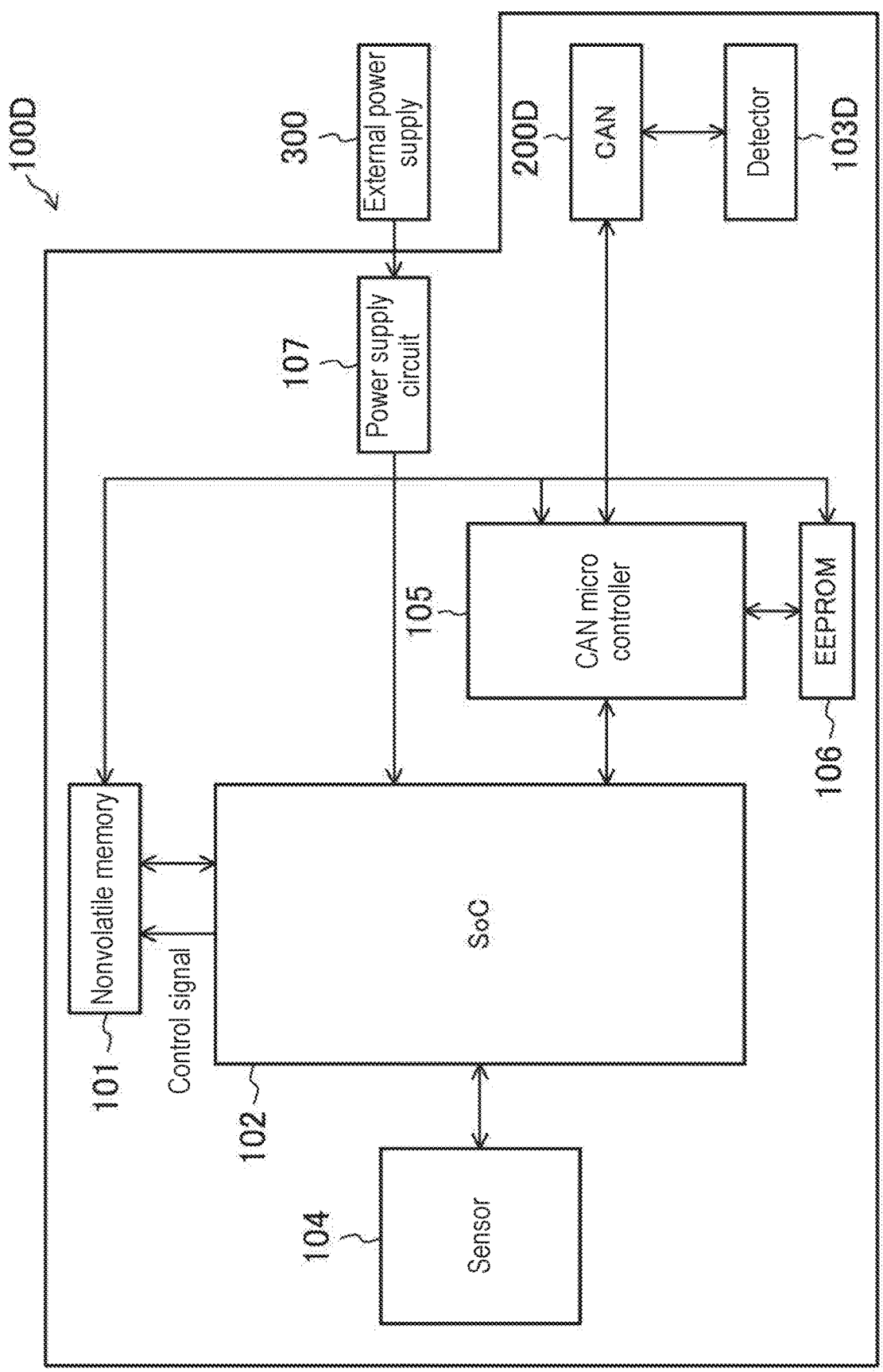

IN-VEHICLE DETECTION SYSTEM AND CONTROL METHOD THEREOF

CROSS-REFERENCE TO RELATED APPLICATIONS

This application claims the benefit of foreign priority of Japanese patent application No. 2018-135862 and No. 2019-022644, filed on Jul. 19, 2018 and Feb. 12, 2019, respectively, the contents all of which are incorporated herein by reference.

TECHNICAL FIELD

The present disclosure relates to an in-vehicle detection system including a system on chip.

BACKGROUND ART

The in-vehicle detection system including a system on chip (SoC) that processes information detected by a camera is currently developed in order to implement various applications such as automatic driving.

In the conventional in-vehicle detection system, a high-speed accessible dynamic random access memory (DRAM) is mounted as a memory that functions as a work memory of the SoC. Because the DRAM is a volatile memory, in the conventional in-vehicle detection system, it is necessary to mount a read only memory (ROM) having the same memory capacity as the DRAM in addition to the DRAM in order to store a program executed by the SoC (see PTL 1).

CITATION LIST

Patent Literature

PTL 1: Unexamined Japanese Patent Publication No. 2007-72627

SUMMARY OF THE INVENTION

An object of the present disclosure is to provide an in-vehicle detection system that can prevent an increase in the memory capacity against high accuracy and large capacity of an in-vehicle sensor or an increase of the application in a vehicle.

In order to achieve the above object, according to one aspect of the present disclosure, an in-vehicle detection system includes a nonvolatile memory, a controller, and a detector that outputs detection information to the controller. The controller reads and writes data from and in the nonvolatile memory.

The controller changes a writing time of a data minimum writing unit of the nonvolatile memory in the in-vehicle detection system by changing a control signal of the nonvolatile memory in accordance with the output of the detector. The controller keeps a clock cycle of the nonvolatile memory constant by setting the clock cycle of the nonvolatile memory to time longer than a maximum value of the writing time.

According to another aspect of the present disclosure, an in-vehicle detection system includes a nonvolatile memory, a controller, and a detector that outputs detection information to the controller. The controller reads and writes data from and in the nonvolatile memory. The controller changes a writing time of a data minimum writing unit of the nonvolatile memory in the in-vehicle detection system by changing a control signal of the nonvolatile memory in accordance with the output of the detector. The controller changes a clock cycle of the nonvolatile memory in accordance with the change in the writing time of the nonvolatile memory.

In the in-vehicle detection system of the present disclosure, the system on chip changes the control signal of the nonvolatile memory according to the output of the detector. For this reason, performance of the nonvolatile memory can be improved even in a severe in-vehicle environment. For example, for use of the nonvolatile memory of a type in which retention performance is degraded at high temperature, when an ambient temperature of the nonvolatile memory becomes greater than or equal to 50° C., the control signal is changed such that the writing time of the nonvolatile memory is lengthened, which allows retention performance of the nonvolatile memory to be maintained.

As described above, in the in-vehicle detection system of the present disclosure, the performance of the nonvolatile memory is improved, so that the system on chip can directly read and write at least a part of data stored in the nonvolatile memory from and in the nonvolatile memory without providing a RAM, such as a DRAM, which functions as the work area. Thus, an increase in a memory capacity or a number of memory devices, namely, an increase in a substrate area is prevented, so that the degree of freedom of mounting the system on the vehicle can be secured. Low power consumption of the system is achieved, and downsizing of a casing size or optimization of a component is performed, so that cost can be reduced.

In the in-vehicle detection system of the present disclosure, the improvement of the performance of the nonvolatile memory can adopt a configuration in which only the nonvolatile memory is used as a memory to be used or a configuration in which the capacity of the DRAM that functions as the work memory is decreased. For this reason, the nonvolatile memory can retain the data during power shutdown, necessity of data transfer from the nonvolatile memory to the DRAM can be eliminated during power-on, and time necessary for the data transfer can be shortened. Thus, the system can be put in a stand-by state at high speed.

The present disclosure can provide the in-vehicle detection system that can prevent the increase in the memory capacity against the high accuracy and large capacity of the in-vehicle sensor or the increase of the application in a vehicle. That is, the in-vehicle detection system in which the degree of freedom of mounting the system on the vehicle can be secured while a waiting time until the stand-by is shortened can be constructed.

BRIEF DESCRIPTION OF DRAWINGS

FIG. 16 is a block diagram illustrating an in-vehicle detection system according to a third modification.

DESCRIPTION OF EMBODIMENT

A problem associated with the conventional system will briefly be described prior to the description of an exemplary embodiment of the present disclosure. In the conventional in-vehicle detection system, a memory capacity of a combination of a DRAM and a ROM increases with a further increase of an application in a vehicle in addition to the high accuracy and large capacity of a sensor (imaging sensor) for a camera aiming at achievement of future automatic driving. When a memory capacity, namely, an area ratio of the DRAM and the ROM to a mounting substrate increases, it is necessary to increase a substrate area, which results in a problem in that a degree of freedom of mounting the system on a vehicle is restricted.

In the conventional in-vehicle detection system, it is necessary to transfer data from the ROM to the DRAM at power-on. For this reason, the time necessary for the system to become a stand-by state is lengthened when a memory capacity increases with increasing system scale. That is, there is also generated a practical problem in that time necessary for departure of the vehicle since starting of the system is lengthened.

An in-vehicle detection system according to an exemplary embodiment of the present disclosure will be described below with reference to the drawings.

Figure 1:
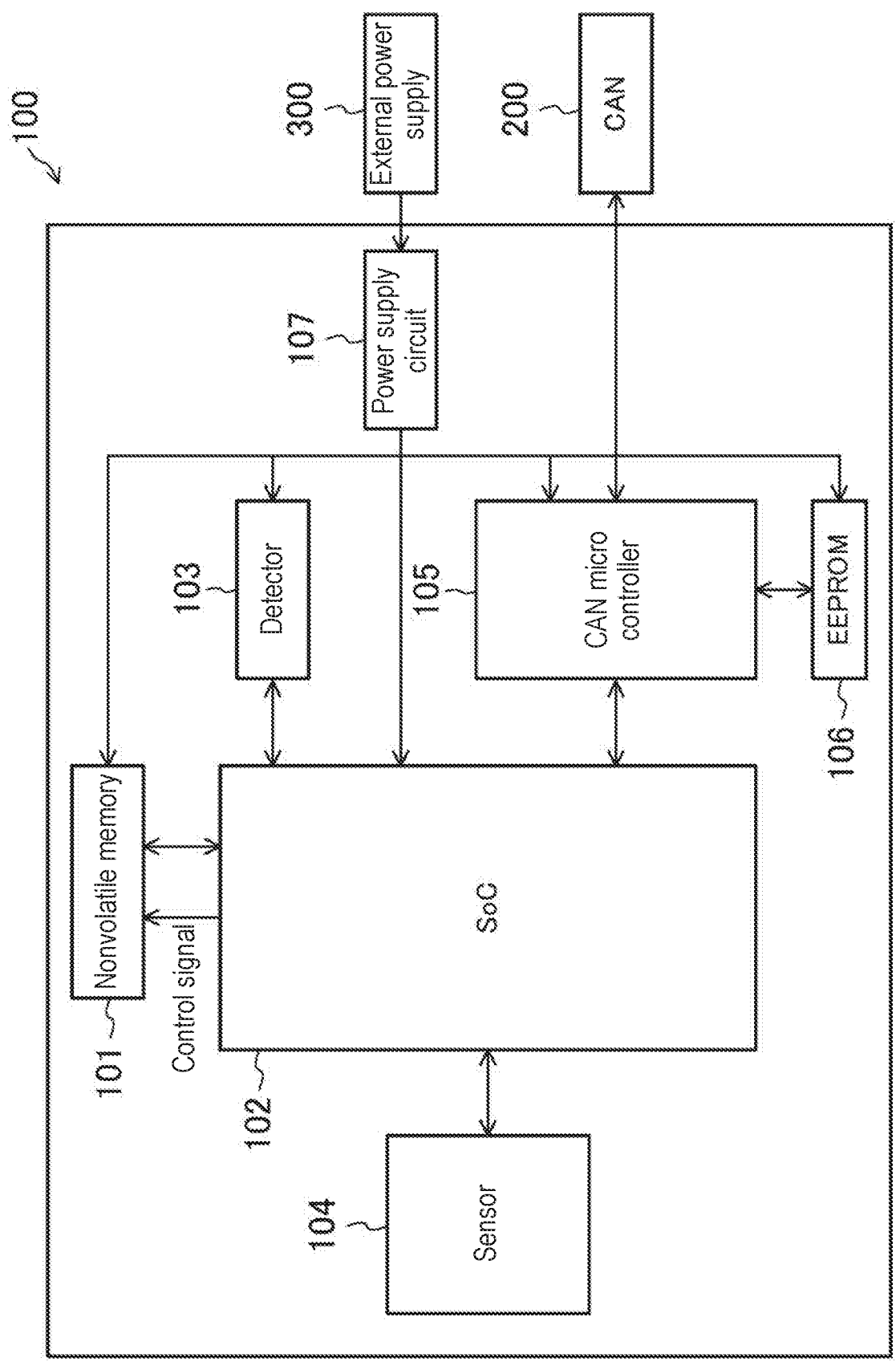
FIG. 1 is a block diagram illustrating an in-vehicle detection system according to an exemplary embodiment.

FIG. 1 is a block diagram illustrating the in-vehicle detection system of the exemplary embodiment. As illustrated in FIG. 1, in-vehicle detection system 100 includes nonvolatile memory 101, a system on chip (SoC) 102 that is a controller and reads and writes data from and in nonvolatile memory 101, and detector 103 that outputs detection information to SoC 102. SoC 102 changes a control signal of nonvolatile memory 101 in accordance with output of detector 103.

A randomly accessible nonvolatile memory may be used as nonvolatile memory 101. For example, a resistance RAM, a ferroelectric RAM, a magnetic RAM, and a phase change memory may be used as nonvolatile memory 101.

SoC 102 includes a microprocessor or a micro controller that operates in accordance with a program stored in nonvolatile memory 101 as a main hardware configuration. Any microprocessor can be used as long as the processor implements a function by executing a program. For example, the microprocessor may be constructed with one or a plurality of electronic circuits including a semiconductor integrated circuit (IC) or a large scale Integration (LSI). The plurality of electronic circuits may be integrated into one chip, or provided in a plurality of chips. The plurality of chips may be integrated into one device, or included in a plurality of devices. Alternatively, the program is not necessarily stored in nonvolatile memory 101 as long as a function equivalent to the program stored in nonvolatile memory 101 can be implemented in the controller.

Detector 103 detects information, such as an ambient temperature and a rewriting frequency of nonvolatile memory 101, which is associated with performance, operation, or the like of nonvolatile memory 101.

In-vehicle detection system 100 further includes sensor 104, such as a camera sensor (imaging sensor), which captures an image of a state outside a vehicle. Information acquired by sensor 104 is output to SoC 102, and SoC 102 processes the information output from sensor 104 using, for example, a program read from nonvolatile memory 101.

In-vehicle detection system 100 may be connected to Controller Area Network (CAN) 200 that is a communication network connecting a plurality of control units mounted on a vehicle to each other. For example, CAN 200 connects the plurality of control units mounted on the vehicle, various in-vehicle sensors, a switch device to one another through a bus, whereby data is shared among the plurality of control units. In-vehicle detection system 100 may further include CAN micro controller 105 that conducts communication between SoC 102 and CAN 200 and an electrically erasable programmable read-only memory (EEPROM) 106 that is a memory for CAN micro controller 105.

In-vehicle detection system 100 may further include power source circuit 107 that supplies a predetermined voltage to each of nonvolatile memory 101, SoC 102, detector 103, CAN micro controller 105, and EEPROM 106. External power source 300 may supply power to power source circuit 107.

In the exemplary embodiment, SoC 102 changes the control signal of nonvolatile memory 101 in accordance with the output of detector 103. For this reason, the performance of nonvolatile memory 101 can be improved even in a severe in-vehicle environment. For example, for use of nonvolatile memory 101 of a type in which retention performance is degraded at high temperature, when the ambient temperature of nonvolatile memory 101 becomes greater than or equal to 50° C., the control signal is changed such that a writing time of nonvolatile memory 101 is lengthened, which allows compensation for a fluctuation in the retention performance of nonvolatile memory 101.

As described above, in the exemplary embodiment, the performance of nonvolatile memory 101 is improved, so that SoC 102 can directly read and write the data from and in nonvolatile memory 101 without providing the DRAM that functions as a work area. Thus, an increase in a memory capacity or a number of memory devices, namely, an increase in a substrate area is prevented, so that the degree of freedom of mounting the system on the vehicle can be secured. Low power consumption of the system is achieved, and downsizing of a casing size or optimization of a component is performed, so that cost can be reduced.

In the exemplary embodiment, the performance of nonvolatile memory 101 is improved, so that only nonvolatile memory 101 can be used in SoC 102. In other words, the DRAM that functions as the work area of SoC 102 needs not to be provided. For this reason, not only nonvolatile memory 101 can retain the data during power shutdown, but also necessity of data transfer from nonvolatile memory 101 to the DRAM can be eliminated during power-on, so that the system can be put in a stand-by state at high speed.

In the exemplary embodiment, for example, for the ambient temperature greater than or equal to 50° C. of nonvolatile memory 101, when the control signal is changed such that the writing time of nonvolatile memory 101 is lengthened, sometimes a response from in-vehicle detection system 100 to an external device is delayed. Thus, in-vehicle detection system 100 may output a signal notifying the external device that, for example, the control is performed to lengthen the writing time of nonvolatile memory 101 through the CAN.

Figure 2:
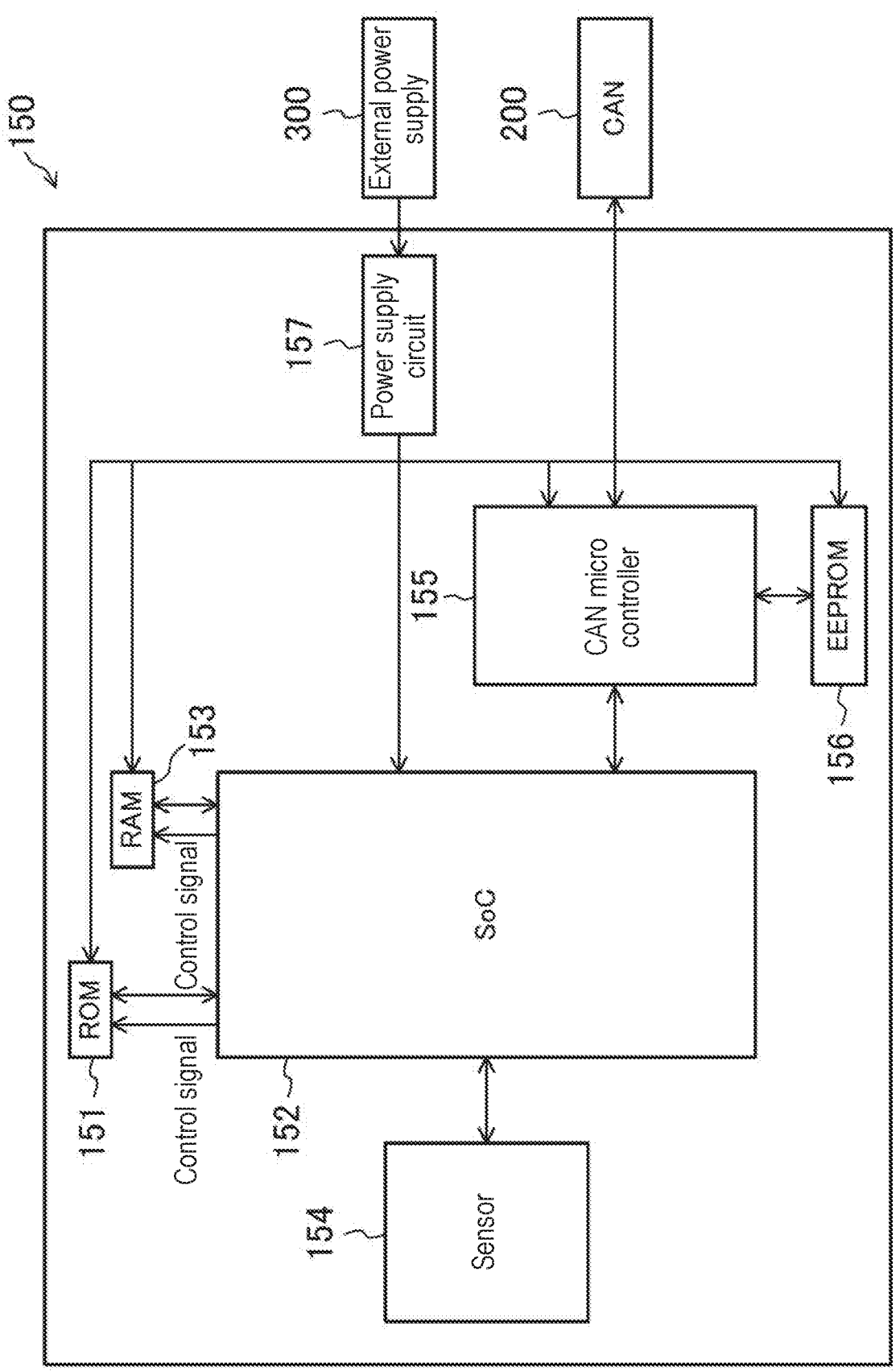
FIG. 2 is a block diagram illustrating an in-vehicle detection system according to a comparative example.

FIG. 2 is a block diagram illustrating an in-vehicle detection system according to a comparative example. As illustrated in FIG. 2, in-vehicle detection system 150 includes ROM 151 such as a flash memory, SoC 152, and RAM 153 such as a high-speed accessible DRAM. A program executed by SoC 152 and the like are stored in ROM 151, and the data is transferred from ROM 151 to RAM 153 at power-on. For this reason, ROM 151 and RAM 153 have the identical memory capacity. SoC 152 reads and writes the data from and in RAM 153 during operation of the system. Similarly to in-vehicle detection system 100 in FIG. 1, in-vehicle detection system 150 includes sensor 154, CAN micro controller 155, and EEPROM 156. In-vehicle detection system 150 also includes power source circuit 157 that supplies a predetermined voltage to ROM 151, SoC 152, RAM 153, CAN micro controller 155, and EEPROM 156.

In in-vehicle detection system 150 of the comparative example, the memory capacity of a combination of ROM 151 and RAM 153 increases with a further increase of an application in the vehicle or the high accuracy and large capacity of the in-vehicle sensor. As a result of increasing an area ratio of ROM 151 and RAM 153 to a mounting substrate, it is necessary to increase a substrate area, which restricts the degree of freedom of mounting the system on the vehicle.

In in-vehicle detection system 150 of the comparative example, it is necessary to transfer the data from ROM 151 to RAM 153 at power-on. For this reason, the time necessary for the system to become the stand-by state is lengthened when the memory capacity increases with increasing system scale. That is, there is a practical problem in that the time necessary for departure of the vehicle since starting of the system is lengthened.

First Example

Figure 3:
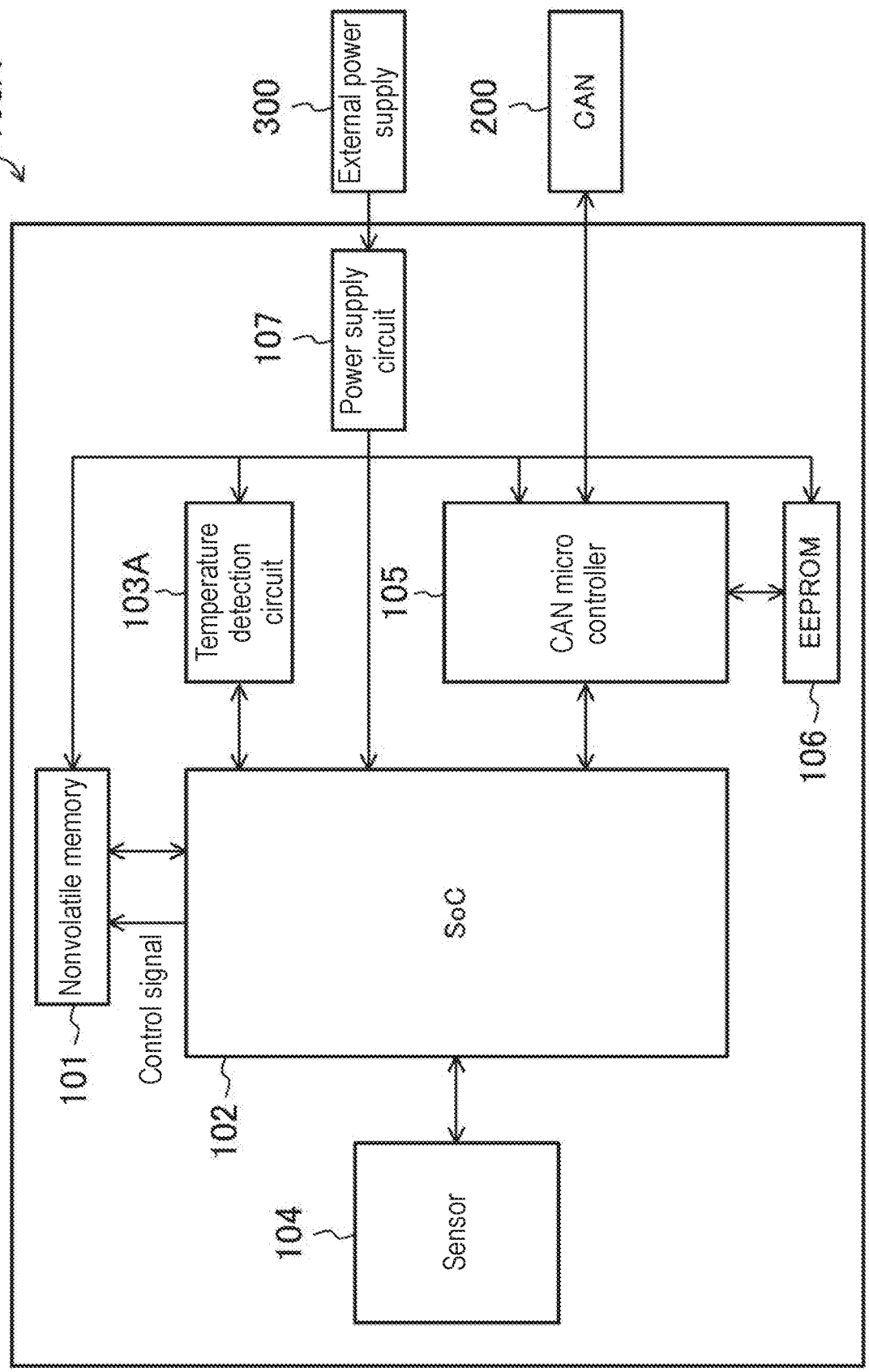
FIG. 3 is a block diagram illustrating an in-vehicle detection system according to a first example.

FIG. 3 is a block diagram illustrating an in-vehicle detection system according to a first example. In FIG. 3, the same component as in-vehicle detection system 100 in FIG. 1 is designated by the same reference numeral, and the overlapping description will be omitted.

In-vehicle detection system 100A of the first example in FIG. 3 includes temperature detection circuit 103A that detects the ambient temperature of nonvolatile memory 101 as detector 103, the ambient temperature of nonvolatile memory 101 influencing the retention performance of nonvolatile memory 101. Temperature detection circuit 103A may be disposed inside or in a vicinity of nonvolatile memory 101. In the first example, SoC 102 changes the control signal of nonvolatile memory 101 according to the output of temperature detection circuit 103A. For this reason, the writing time of nonvolatile memory 101 can be adjusted according to an influence degree of the ambient temperature of nonvolatile memory 101 on the retention performance Thus, the fluctuation in the retention performance caused by the ambient temperature of nonvolatile memory 101 is compensated for, so that the performance of nonvolatile memory 101 can be improved even in the severe in-vehicle environment.

Figure 4:
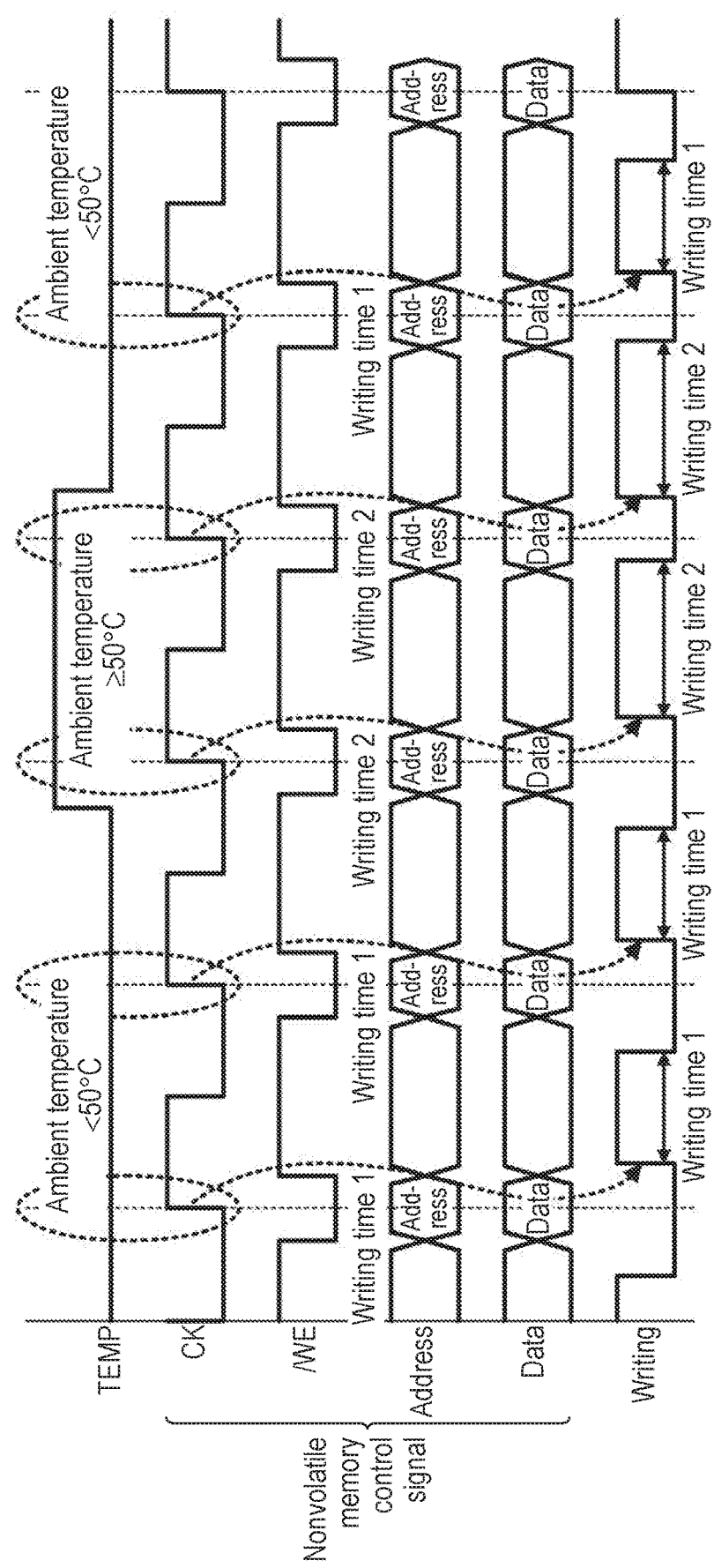
FIG. 4 is a timing chart illustrating an example of a relationship between an ambient temperature of a nonvolatile memory and a control signal in the in-vehicle detection system of the first example.

FIG. 4 is a timing chart illustrating an example of a relationship between the ambient temperature of nonvolatile memory 101 and the control signal of SoC 102 in in-vehicle detection system 100A of the first example. In FIG. 4, "TEMP" represents the output (the ambient temperature of nonvolatile memory 101) of temperature detection circuit 103A, "CK" represents a clock signal, "/WE" represents a writing signal, "address" represents an address signal, "data" represents a data signal, and "writing" represents the writing time of nonvolatile memory 101 of the minimum writing unit of the data in in-vehicle detection system 100A (the same holds true for FIGS. 5 to 7). The example aims at nonvolatile memory 101 of type in which the retention performance is degraded at high temperature.

The data writing unit in in-vehicle detection system 100A is a page including the data and a management area, for example, 512+16 bytes for a NAND type flash memory, and 1 byte or 1 word for NOR type flash memory.

As illustrated in FIG. 4, a cycle of clock signal CK is kept constant irrespective of ambient temperature TEMP. When clock signal CK rises to high, nonvolatile memory 101 starts capture of writing signal/WE and the new address and data, thereby starting the writing in nonvolatile memory 101. In the example, SoC 102 gives writing time information corresponding to ambient temperature TEMP to the address signal. Specifically, as illustrated in FIG. 4, SoC 102 sets the address signal such that the writing is performed for the normal writing time (writing time 1: for example, 1 microsecond) when ambient temperature TEMP is less than 50° C., and SoC 102 sets the address signal such that the writing is performed for the writing time (writing time 2: for example, 100 microseconds) longer than the normal writing time when ambient temperature TEMP is greater than or equal to 50° C. Consequently, SoC 102 compensates for the fluctuation in the retention performance caused by the ambient temperature of nonvolatile memory 101. In the example, SoC 102 sets the cycle of clock signal CK to the time longer than "writing time 2" (that is, the maximum value of the writing time), whereby the cycle of clock signal CK is kept constant irrespective of ambient temperature TEMP.

In the above description, for example, "writing time 1" is 1 microsecond, and "writing time 2" is 100 microseconds, so that "writing time 1" and "writing time 2" differs from each other by 100 times. However, in the timing chart of FIG. 4, a width of "writing time 2" is expressed smaller than the actual width for convenience. This expression holds true for other timing charts described below.

Figure 5:
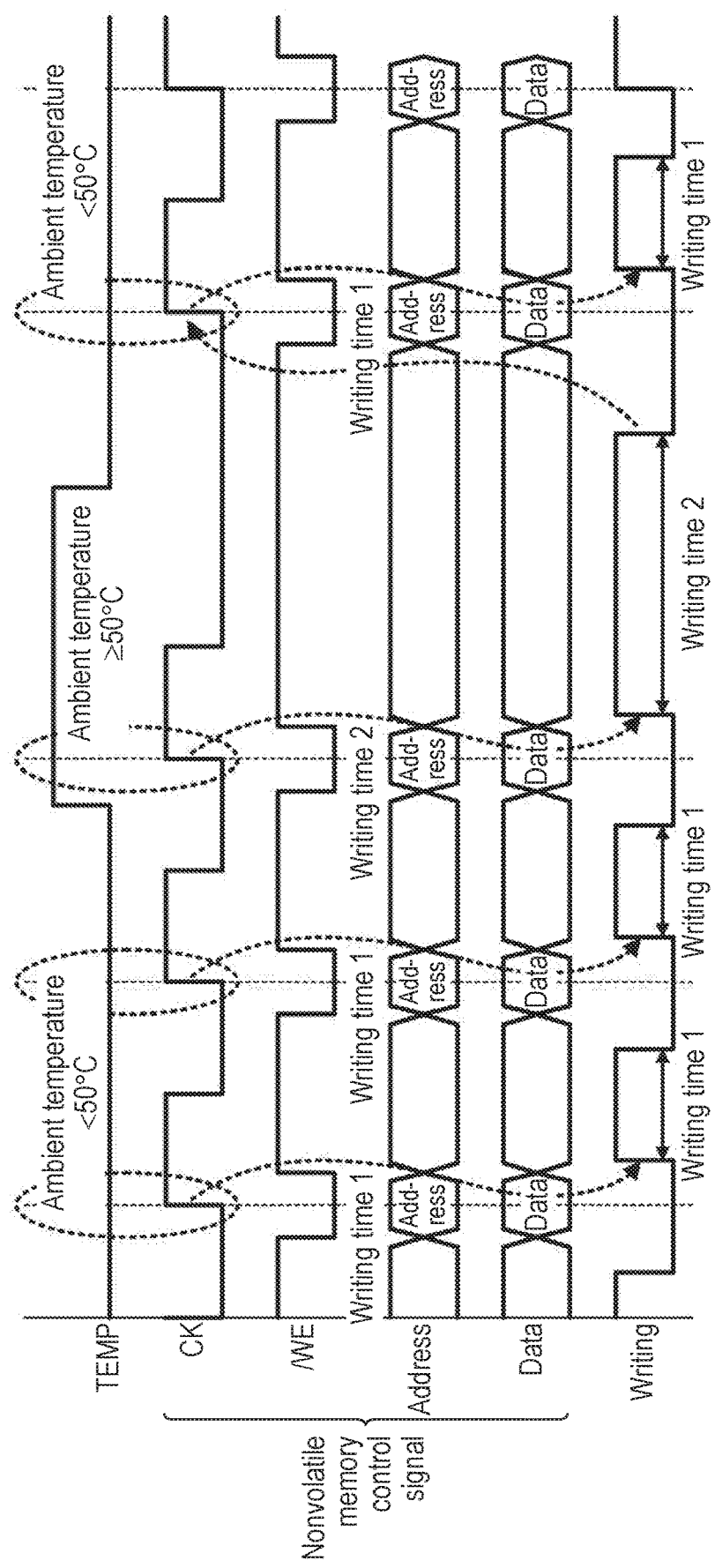
FIG. 5 is a timing chart illustrating an example of the relationship between the ambient temperature of the nonvolatile memory and the control signal in the in-vehicle detection system of the first example.

FIG. 5 is a timing chart illustrating another example of the relationship between the ambient temperature of nonvolatile memory 101 and the control signal of SoC 102 in in-vehicle detection system 100A of the first example. The example also aims at nonvolatile memory 101 of type in which the retention performance is degraded at high temperature.

As illustrated in FIG. 5, when clock signal CK rises to high, nonvolatile memory 101 starts capture of writing signal/WE and the new address and data, thereby starting the writing in nonvolatile memory 101. In the example, SoC 102 also gives writing time information corresponding to ambient temperature TEMP to the address signal. Specifically, as illustrated in FIG. 5, SoC 102 sets the address signal such that the writing is performed for the normal writing time (writing time 1) when ambient temperature TEMP is less than 50° C., and SoC 102 sets the address signal such that the writing is performed for the writing time (writing time 2) longer than the normal writing time when ambient temperature TEMP is greater than or equal to 50° C. Consequently, SoC 102 compensates for the fluctuation in the retention performance caused by the ambient temperature of nonvolatile memory 101. In the example, when ambient temperature TEMP is greater than or equal to 50° C., SoC 102 puts clock signal CK to high after the ending of the writing (writing time 2 elapses), namely, SoC 102 keeps clock signal CK at low until the ending of the writing, which allows the cycle of clock signal CK to be lengthen as compared with the case that ambient temperature TEMP is less than 50° C.

Figure 6:
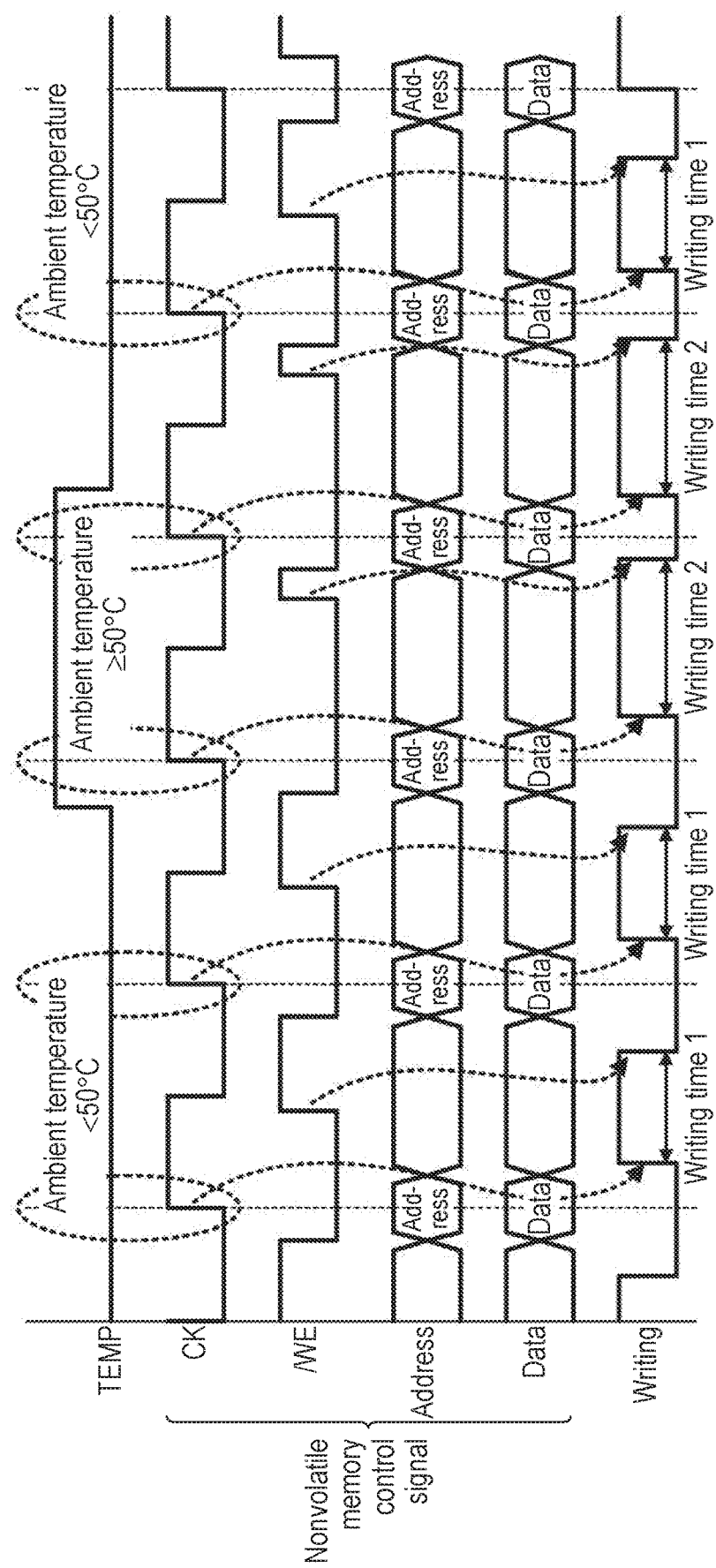
FIG. 6 is a timing chart illustrating an example of the relationship between the ambient temperature of the nonvolatile memory and the control signal in the in-vehicle detection system of the first example.

FIG. 6 is a timing chart illustrating another example of the relationship between the ambient temperature of nonvolatile memory 101 and the control signal of SoC 102 in in-vehicle detection system 100A of the first example. The example also aims at nonvolatile memory 101 of type in which the retention performance is degraded at high temperature.

As illustrated in FIG. 6, a cycle of clock signal CK is kept constant irrespective of ambient temperature TEMP. When clock signal CK rises to high, nonvolatile memory 101 starts capture of writing signal/WE and the new address and data, thereby starting the writing in nonvolatile memory 101. In the example, SoC 102 ends the writing in nonvolatile memory 101 at timing of the rise of writing signal/WE to high. Specifically, as illustrated in FIG. 6, when ambient temperature TEMP is less than 50° C., SoC 102 puts writing signal/WE to high at the normal timing to set the normal writing time (writing time 1). On the other hand, when ambient temperature TEMP is greater than or equal to 50° C., SoC 102 puts writing signal/WE high at the timing later than the normal timing to set the writing time (writing time 2) that is longer than the normal writing time. Consequently, SoC 102 compensates for the fluctuation in the retention performance caused by the ambient temperature of nonvolatile memory 101. In the example, SoC 102 sets the cycle of clock signal CK to the time longer than "writing time 2" (that is, the maximum value of the writing time), whereby the cycle of clock signal CK is kept constant irrespective of ambient temperature TEMP.

Figure 7:
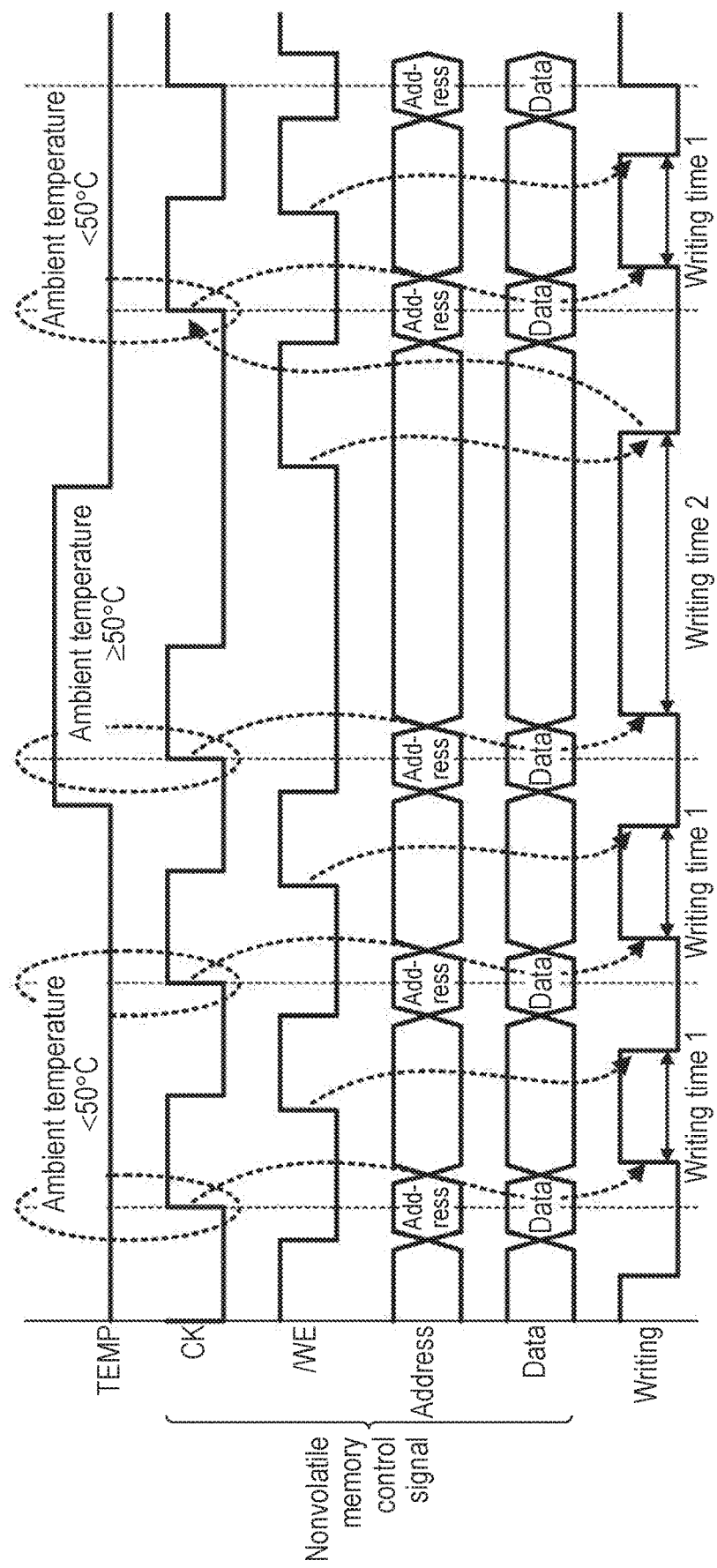
FIG. 7 is a timing chart illustrating an example of the relationship between the ambient temperature of the nonvolatile memory and the control signal in the in-vehicle detection system of the first example.

FIG. 7 is a timing chart illustrating another example of the relationship between the ambient temperature of nonvolatile memory 101 and the control signal of SoC 102 in in-vehicle detection system 100A of the first example. The example also aims at nonvolatile memory 101 of type in which the retention performance is degraded at high temperature.

As illustrated in FIG. 7, when clock signal CK rises to high, nonvolatile memory 101 starts capture of writing signal/WE and the new address and data, thereby starting the writing in nonvolatile memory 101. In the example, SoC 102 also ends the writing in nonvolatile memory 101 at the timing of the rise of writing signal/WE to high. Specifically, as illustrated in FIG. 7, when ambient temperature TEMP is less than 50° C., SoC 102 puts writing signal/WE to high at the normal timing to set the normal writing time (writing time 1). On the other hand, when ambient temperature TEMP is greater than or equal to 50° C., SoC 102 puts writing signal/WE high at the timing later than the normal timing to set the writing time (writing time 2) that is longer than the normal writing time. Consequently, SoC 102 compensates for the fluctuation in the retention performance caused by the ambient temperature of nonvolatile memory 101. In the example, when ambient temperature TEMP is greater than or equal to 50° C., SoC 102 puts clock signal CK to high after the ending of the writing (writing time 2 elapses), namely, SoC 102 keeps clock signal CK at low until the ending of the writing, which allows the cycle of clock signal CK to be lengthen as compared with the case that ambient temperature TEMP is less than 50° C.

In the first example, a threshold of the ambient temperature that changes the writing time of nonvolatile memory 101 is 50° C. Alternatively, the threshold may be set higher or lower that 50° C. according to a memory characteristic. The threshold of the ambient temperature may be set in a multi step as necessary. For example, the threshold of the ambient temperature, namely, the accuracy may be set within ±10% (a range of 45° C. to 55° C. for the threshold of 50° C.). The range can appropriately be set according to the memory characteristic.

The first example aims at nonvolatile memory 101 of the type in which the retention performance is degraded at high temperature. When a nonvolatile memory of a type in which the retention performance is improved at high temperature is used instead of this, SoC 102 may perform the writing for the writing time shorter than the normal writing time for the ambient temperature greater than or equal to the threshold.

In the first example, by way of example, "writing time 1" is 1 microsecond, and "writing time 2" is 100 microseconds. However, "writing time 1" and "writing time 2" are not particularly limited, but may appropriately be set according to the memory characteristic. For example, "writing time 1" may be set to 1 microsecond while "writing time 2" is set to 100 microseconds when nonvolatile memory 101 is the resistance RAM, and "writing time 1" may be set to about 10 nanoseconds to about 100 nanoseconds while "writing time 2" is set to 100 microseconds when nonvolatile memory 101 is the magnetic RAM. The description of "writing time 1" and "writing time 2" is similar to that of the following second example.

Second Example

Figure 8:
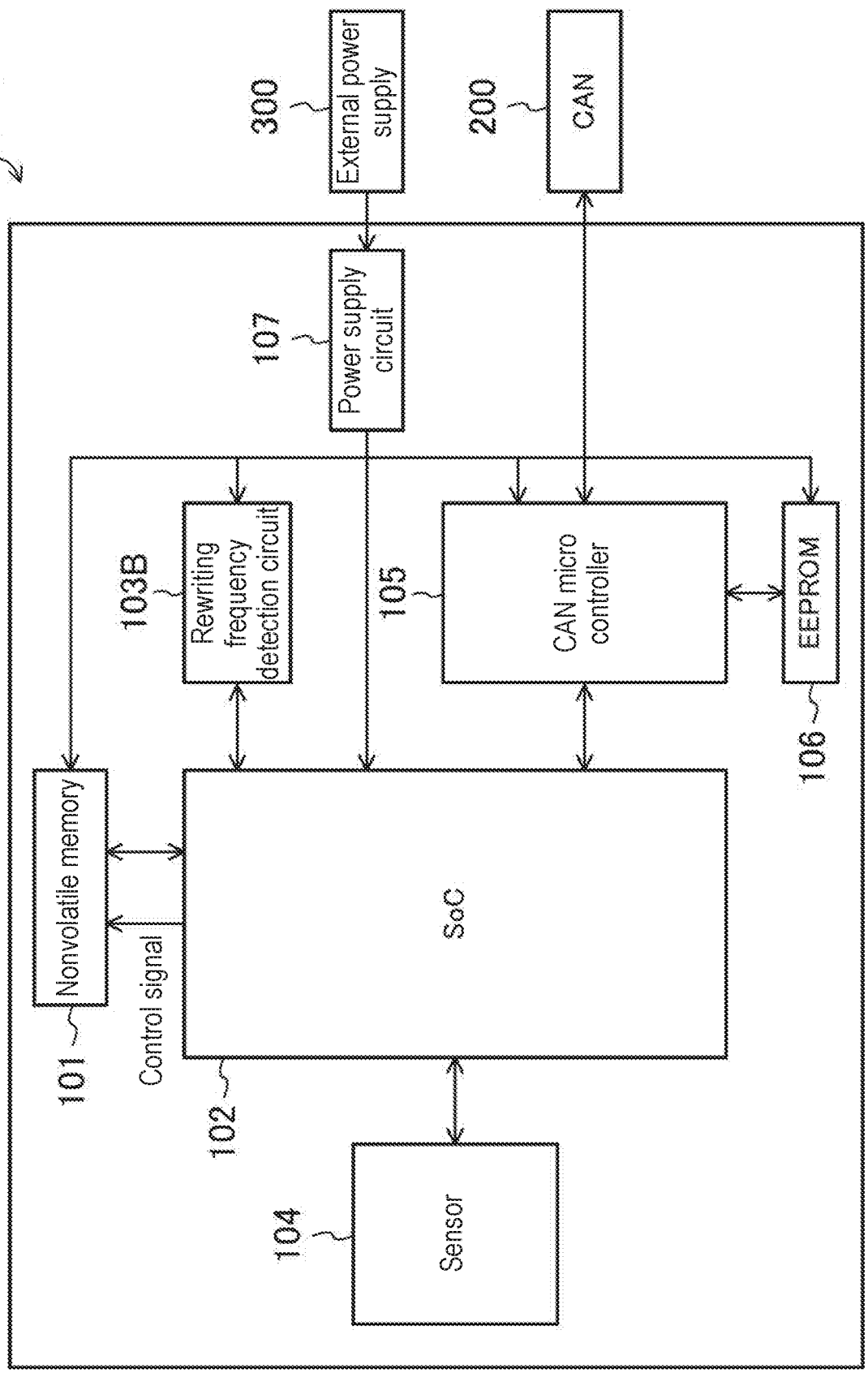
FIG. 8 is a block diagram illustrating an in-vehicle detection system according to a second example.

FIG. 8 is a block diagram illustrating an in-vehicle detection system according to a second example. In FIG. 8, the same component as in-vehicle detection system 100 in FIG. 1 is designated by the same reference numeral, and the overlapping description will be omitted.

In-vehicle detection system 100B of the second example in FIG. 8 includes rewriting frequency detection circuit 103B that detects a rewriting frequency (rewriting times per unit time) of nonvolatile memory 101 as detector 103, the rewriting frequency of nonvolatile memory 101 influencing the retention performance of nonvolatile memory 101. Rewriting frequency detection circuit 103B may be disposed inside or in the vicinity of nonvolatile memory 101. In the second example, SoC 102 changes the control signal of nonvolatile memory 101 according to the output of rewriting frequency detection circuit 103B, so that the writing time of nonvolatile memory 101 can be adjusted according to the influence degree of the rewriting frequency of nonvolatile memory 101 on the retention performance. Thus, the fluctuation in the retention performance caused by the rewriting frequency of nonvolatile memory 101 is compensated for, so that the performance of nonvolatile memory 101 can be improved even in the severe in-vehicle environment.

Figure 9:
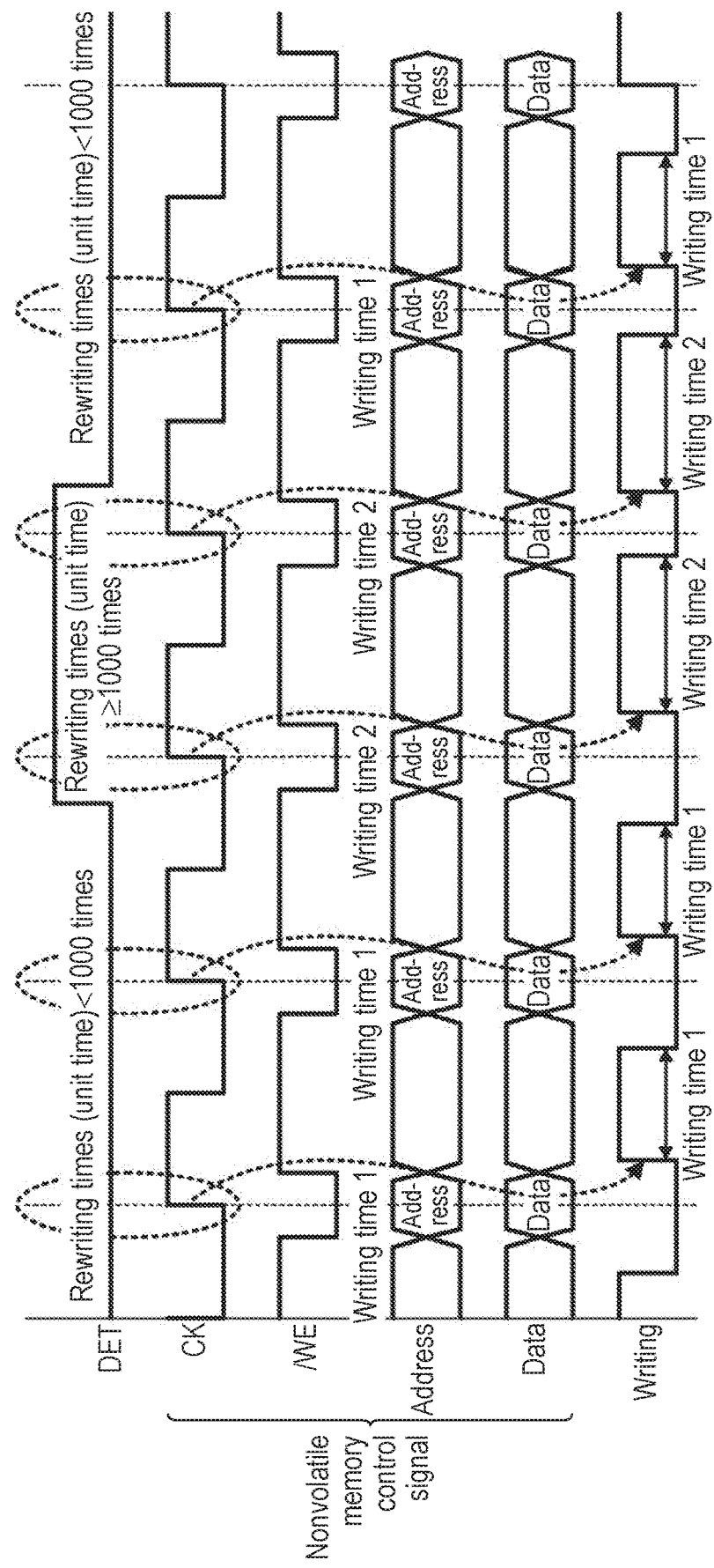
FIG. 9 is a timing chart illustrating an example of the relationship between the rewriting frequency of the nonvolatile memory and the control signal in the in-vehicle detection system of the second example.

FIG. 9 is a timing chart illustrating an example of a relationship between the rewriting frequency of nonvolatile memory 101 and the control signal of SoC 102 in in-vehicle detection system 100B of the second example. In FIG. 9, "DET" represents the output (the rewriting frequency (rewriting times per unit time) of nonvolatile memory 101) of rewriting frequency detection circuit 103B, "CK" represents the clock signal, "/WE" represents the writing signal, "address" represents the address signal, "data" represents the data signal, and "writing" represents the writing time of nonvolatile memory 101 (the same holds true for FIGS. 10 to 12). The example aims at nonvolatile memory 101 of type in which the retention performance is degraded when the rewriting frequency increases.

As illustrated in FIG. 9, the cycle of clock signal CK is kept constant irrespective of writing frequency DET. When clock signal CK rises to high, nonvolatile memory 101 starts capture of writing signal/WE and the new address and data, thereby starting the writing in nonvolatile memory 101. In the example, SoC 102 gives writing time information corresponding to rewriting frequency DET to the address signal. Specifically, as illustrated in FIG. 9, SoC 102 sets the address signal such that the writing is performed for the normal writing time (writing time 1) when the rewriting frequency DET (rewriting times per unit time) is less than 1000 times, and SoC 102 sets the address signal such that the writing is performed for the writing time (writing time 2) longer than the normal writing time when rewriting frequency DET is greater than or equal to 1000 times. Consequently, SoC 102 compensates for the fluctuation in the retention performance caused by the rewriting frequency of nonvolatile memory 101. In the example, SoC 102 sets the cycle of clock signal CK to the time longer than "writing time 2" (that is, the maximum value of the writing time), whereby the cycle of clock signal CK is kept constant irrespective of ambient temperature TEMP.

Figure 10:
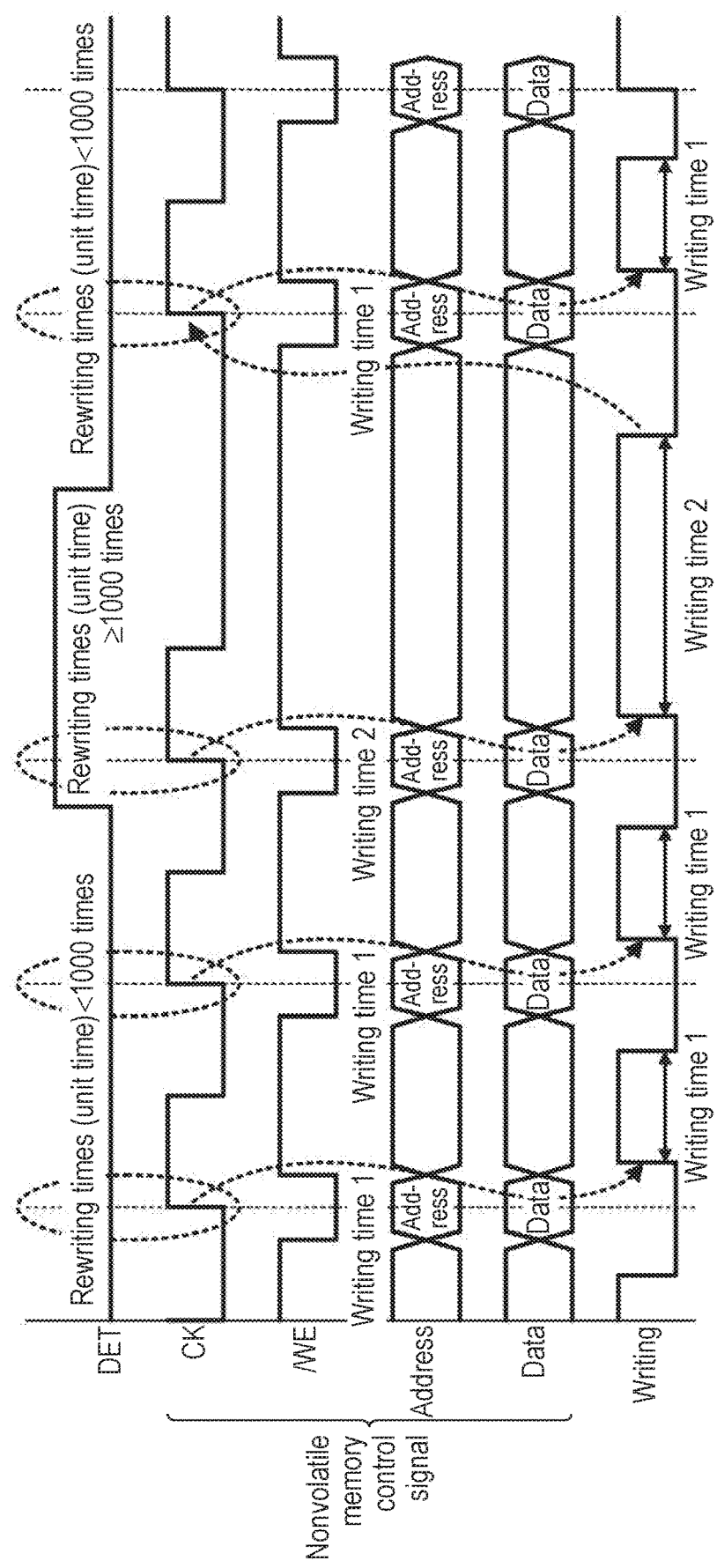
FIG. 10 is a timing chart illustrating an example of the relationship between the rewriting frequency of the nonvolatile memory and the control signal in the in-vehicle detection system of the second example.

FIG. 10 is a timing chart illustrating another example of the relationship between the rewriting frequency of nonvolatile memory 101 and the control signal of SoC 102 in in-vehicle detection system 100B of the second example. The example aims at nonvolatile memory 101 of type in which the retention performance is degraded when the rewriting frequency increases.

As illustrated in FIG. 10, when clock signal CK rises to high, nonvolatile memory 101 starts capture of writing signal/WE and the new address and data, thereby starting the writing in nonvolatile memory 101. In the example, SoC 102 also gives writing time information corresponding to rewriting frequency DET to the address signal. Specifically, SoC 102 sets the address signal such that the writing is performed for the normal writing time (writing time 1) when the rewriting frequency DET (rewriting times per unit time) is less than 1000 times, and SoC 102 sets the address signal such that the writing is performed for the writing time (writing time 2) longer than the normal writing time when rewriting frequency DET is greater than or equal to 1000 times. Consequently, SoC 102 compensates for the fluctuation in the retention performance caused by the rewriting frequency of nonvolatile memory 101. In the example, when rewriting frequency DET is greater than or equal to 1000 times, SoC 102 puts clock signal CK to high after the ending of the writing (writing time 2 elapses), namely, SoC 102 keeps clock signal CK low until the ending of the writing, which allows the cycle of clock signal CK to be lengthen as compared with the case that rewriting frequency DET is less than 1000 times.

Figure 11:
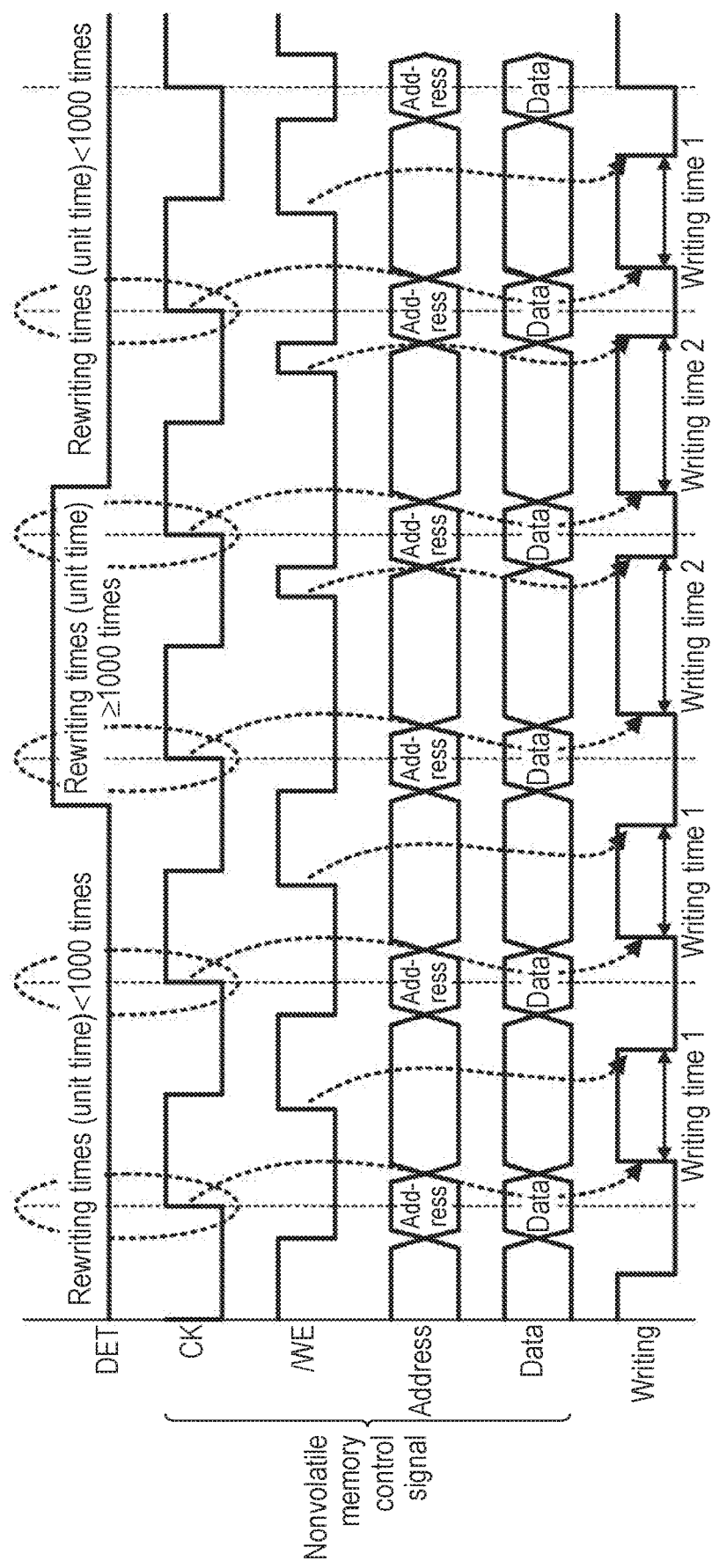
FIG. 11 is a timing chart illustrating an example of the relationship between the rewriting frequency of the nonvolatile memory and the control signal in the in-vehicle detection system of the second example.

FIG. 11 is a timing chart illustrating another example of the relationship between the rewriting frequency of nonvolatile memory 101 and the control signal of SoC 102 in in-vehicle detection system 100B of the second example. The example aims at nonvolatile memory 101 of type in which the retention performance is degraded when the rewriting frequency increases.

As illustrated in FIG. 11, the cycle of clock signal CK is kept constant irrespective of rewriting frequency DET. When clock signal CK rises to high, nonvolatile memory 101 starts capture of writing signal/WE and the new address and data, thereby starting the writing in nonvolatile memory 101. In the example, SoC 102 ends the writing in nonvolatile memory 101 at timing of the rise of writing signal/WE to high. Specifically, as illustrated in FIG. 11, when rewriting frequency DET (rewriting times per unit time) is less than 1000 times, SoC 102 puts writing signal/WE high at the normal timing to set the normal writing time (writing time 1). On the other hand, when rewriting frequency DET is greater than or equal to 1000 times, SoC 102 puts writing signal/WE high at the timing later than the normal timing to set the writing time (writing time 2) that is longer than the normal writing time. Consequently, SoC 102 compensates for the fluctuation in the retention performance caused by the rewriting frequency of nonvolatile memory 101. In the example, SoC 102 sets the cycle of clock signal CK to the time longer than "writing time 2" (that is, the maximum value of the writing time), whereby the cycle of clock signal CK is kept constant irrespective of ambient temperature TEMP.

Figure 12:
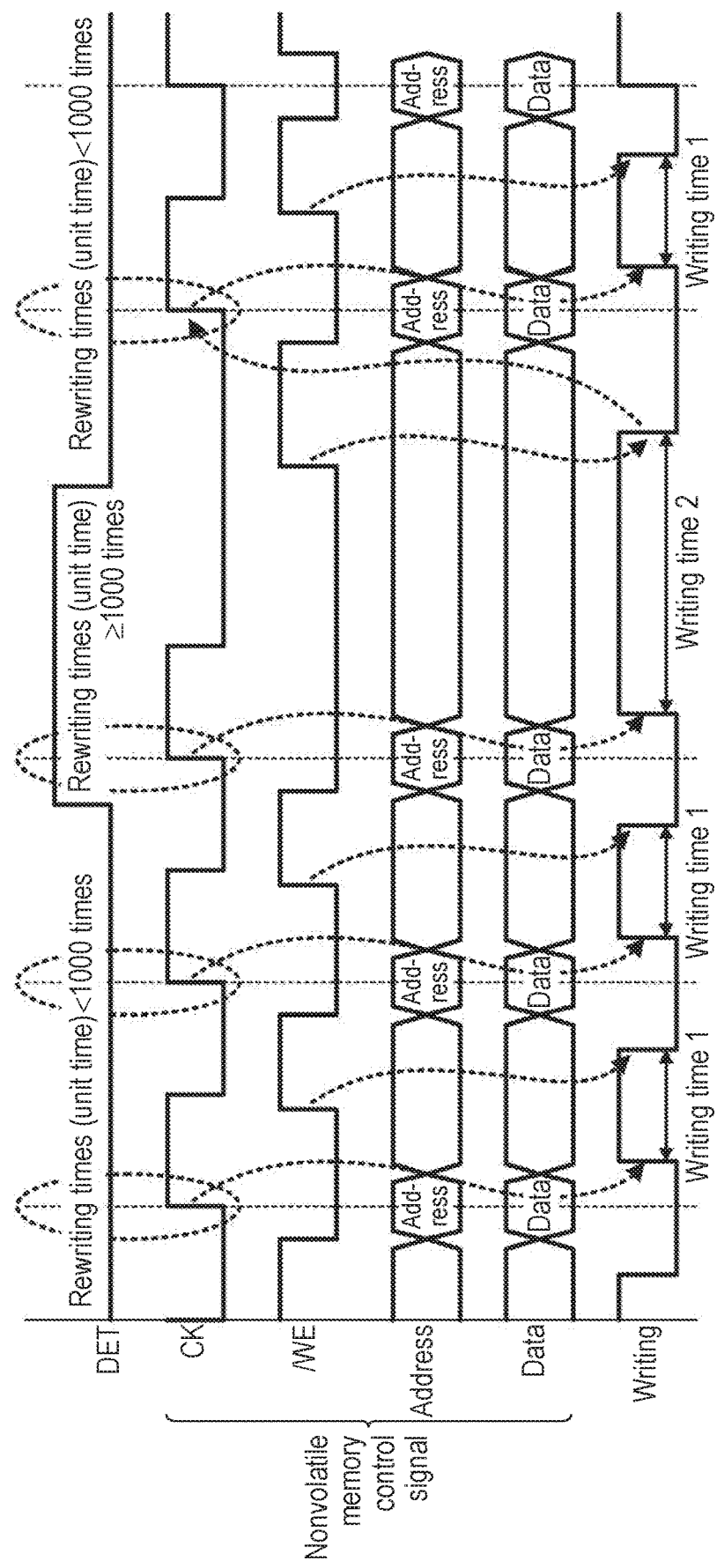
FIG. 12 is a timing chart illustrating an example of the relationship between the rewriting frequency of the nonvolatile memory and the control signal in the in-vehicle detection system of the second example.

FIG. 12 is a timing chart illustrating another example of the relationship between the rewriting frequency of nonvolatile memory 101 and the control signal of SoC 102 in in-vehicle detection system 100B of the second example. The example of FIG. 12 aims at nonvolatile memory 101 of type in which the retention performance is degraded when the rewriting frequency increases.

As illustrated in FIG. 12, when clock signal CK rises to high, nonvolatile memory 101 starts capture of writing signal/WE and the new address and data, thereby starting the writing in nonvolatile memory 101. In the example, SoC 102 also ends the writing in nonvolatile memory 101 at the timing of the rise of writing signal/WE to high. Specifically, as illustrated in FIG. 12, when rewriting frequency DET (rewriting times per unit time) is less than 1000 times, SoC 102 puts writing signal/WE high at the normal timing to set the normal writing time (writing time 1). On the other hand, when rewriting frequency DET is greater than or equal to 1000 times, SoC 102 puts writing signal/WE high at the timing later than the normal timing to set the writing time (writing time 2) that is longer than the normal writing time. Consequently, SoC 102 compensates for the fluctuation in the retention performance caused by the rewriting frequency of nonvolatile memory 101. In the example, when rewriting frequency DET is greater than or equal to 1000 times, SoC 102 puts clock signal CK to high after the ending of the writing (writing time 2 elapses), namely, SoC 102 keeps clock signal CK low until the ending of the writing, which allows the cycle of clock signal CK to be lengthen as compared with the case that rewriting frequency DET is less than 1000 times.

In the second example, the threshold of the rewriting frequency that changes the writing time of nonvolatile memory 101 is 1000 times. Alternatively, the threshold may be set greater than 1000 times (however, up to about 10 million times) or less than 1000 times (however up to about 100 times) according to the memory characteristic. That is, the threshold of the rewriting frequency has a width from about 100 times to about 10 million times according to a kind of nonvolatile memory 101, so that the threshold may appropriately be set according to the memory characteristic. The threshold of the rewriting frequency may be set in a multi step as necessary. For example, the threshold of the rewriting frequency, namely, the accuracy may be set within ±10% (a range of 900 times to 1100 times for the threshold of 1000 times). The range can appropriately be set according to the memory characteristic.

The second example aims at nonvolatile memory 101 of the type in which the retention performance is degraded at high rewriting frequency. When a nonvolatile memory of a type in which the retention performance is improved at high rewriting frequency is used instead of this, SoC 102 may perform the writing for the writing time shorter than the normal writing time for the rewriting frequency greater than or equal to the threshold.

In the first and second examples, the control signal of the nonvolatile memory is changed according to the ambient temperature or the rewriting frequency of the nonvolatile memory. Alternatively, another piece of information about the performance or operation of the nonvolatile memory is detected, and the control signal of the nonvolatile memory may be changed according to the detected information.

(First Modification)

In the first and second examples, SoC 102 changes the writing time of nonvolatile memory 101 by changing the control signal of nonvolatile memory 101 according to the output of detector 103 (temperature detection circuit 103A or rewriting frequency detection circuit 103B).

On the other hand, in a first modification, nonvolatile memory 101 includes a plurality of memory arrays, and SoC 102 changes a writing target memory array of nonvolatile memory 101 by changing the control signal of nonvolatile memory 101 according to the output of detector 103.

Figure 13:
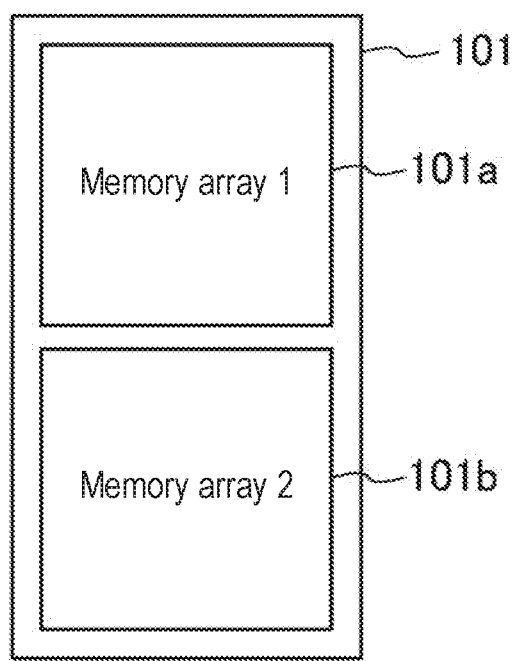
FIG. 13 is a block diagram illustrating a nonvolatile memory in an in-vehicle detection system according to a first modification.

FIG. 13 is a schematic diagram illustrating an example of a configuration of nonvolatile memory 101 of the first modification. As illustrated in FIG. 13, nonvolatile memory 101 of the first modification includes memory array 101a (memory array 1) having the normal retention performance at high temperature and memory array 101b (memory array 2) having the excellent retention performance at high temperature.

The in-vehicle detection system of the first modification having the configuration similar to that of the in-vehicle detection system of the first example in FIG. 3 except for nonvolatile memory 101 will be described below.

In the first modification, SoC 102 can select one of memory array 1 and memory array 2 that are the writing target memory array of nonvolatile memory 101 in accordance with the ambient temperature of nonvolatile memory 101 by changing the control signal of nonvolatile memory 101 in accordance with the output of temperature detection circuit 103A. Thus, the fluctuation in the retention performance caused by the ambient temperature of nonvolatile memory 101 is compensated for, so that the performance of nonvolatile memory 101 can be improved even in the severe in-vehicle environment.

Figure 14:
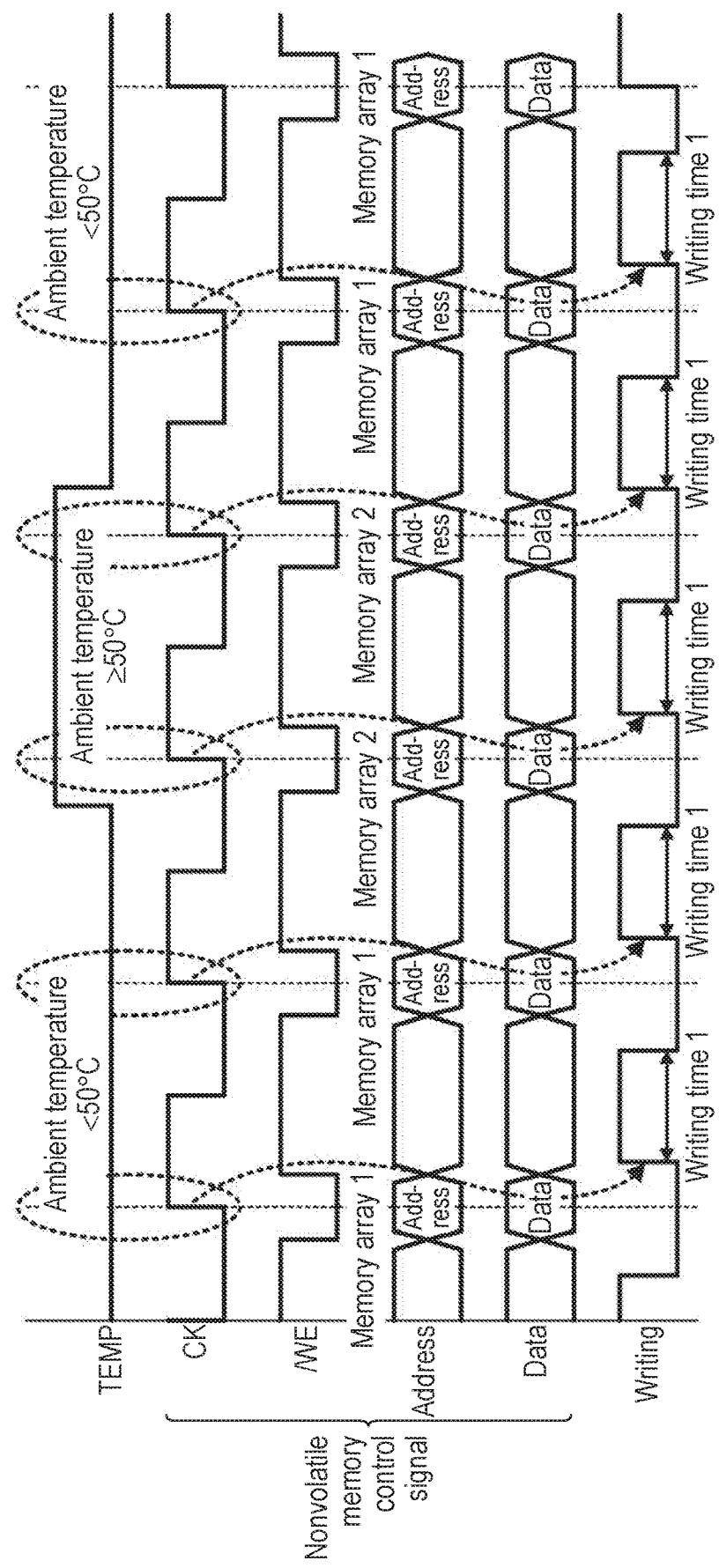
FIG. 14 is a timing chart illustrating an example of the relationship between the ambient temperature of the nonvolatile memory and the control signal in the in-vehicle detection system of the first modification.

FIG. 14 is a timing chart illustrating an example of the relationship between the ambient temperature of nonvolatile memory 101 and the control signal of SoC 102 in the first modification. In FIG. 14, "TEMP" represents the output (the ambient temperature of nonvolatile memory 101) of temperature detection circuit 103A, "CK" represents a clock signal, "/WE" represents the writing signal, "address" represents the address signal, "data" represents the data signal, and "writing" represents the writing time of nonvolatile memory 101.

As illustrated in FIG. 14, the cycle of clock signal CK is kept constant irrespective of ambient temperature TEMP. When clock signal CK rises to high, nonvolatile memory 101 starts capture of writing signal/WE and the new address and data, thereby starting the writing in nonvolatile memory 101. In the first modification, SoC 102 gives the writing target memory array information corresponding to ambient temperature TEMP to the address signal. Specifically, as illustrated in FIG. 14, SoC 102 sets the address signal such that the writing is performed in memory array 1 having the normal retention performance at high temperature when ambient temperature TEMP is less than 50° C., and SoC 102 sets the address signal such that the writing is performed in memory array 2 having the excellent retention performance at high temperature when ambient temperature TEMP is greater than or equal to 50° C. Consequently, SoC 102 compensates for the fluctuation in the retention performance caused by the ambient temperature of nonvolatile memory 101.

The in-vehicle detection system of the first modification having the configuration similar to that of in-vehicle detection system 100A of the first example in FIG. 3 is described above. The first modification can be also applied to in-vehicle detection system 100B of the second example in FIG. 8.

That is, nonvolatile memory 101 includes a memory array (memory array 1) having the normal retention performance at high rewriting frequency and a memory array (memory array 2) having the excellent retention performance at high rewriting frequency, and SoC 102 may change the writing target memory array of nonvolatile memory 101 according to the rewriting frequency of nonvolatile memory 101 by changing the control signal of nonvolatile memory 101 according to the output of rewriting frequency detection circuit 103B. Consequently, the fluctuation in the retention performance caused by the rewriting frequency of nonvolatile memory 101 is compensated for, so that the performance of nonvolatile memory 101 can be improved even in the severe in-vehicle environment.

In the control of nonvolatile memory 101 in this case, for example, the performance of the writing in memory array 1 having the normal retention performance at high rewriting frequency may be set to the address signal when the rewriting frequency is less than the threshold, and the performance of the writing in memory array 2 having the excellent retention performance at high rewriting frequency may be set to the address signal when the rewriting frequency is greater than or equal to the threshold.

In the first modification, the threshold of the ambient temperature or rewriting frequency changing the writing target memory array of nonvolatile memory 101 is not particularly limited, but may arbitrarily be set according to the memory characteristic, or may be set in a multi step as necessary.

In the first modification, the control signal of nonvolatile memory 101 is changed in accordance with the ambient temperature or the rewriting frequency of nonvolatile memory 101. Alternatively, another piece of information about the performance or operation of nonvolatile memory 101 is detected, and the control signal of nonvolatile memory 101 may be changed in accordance with the detected information.

(Second Modification)

Figure 15:
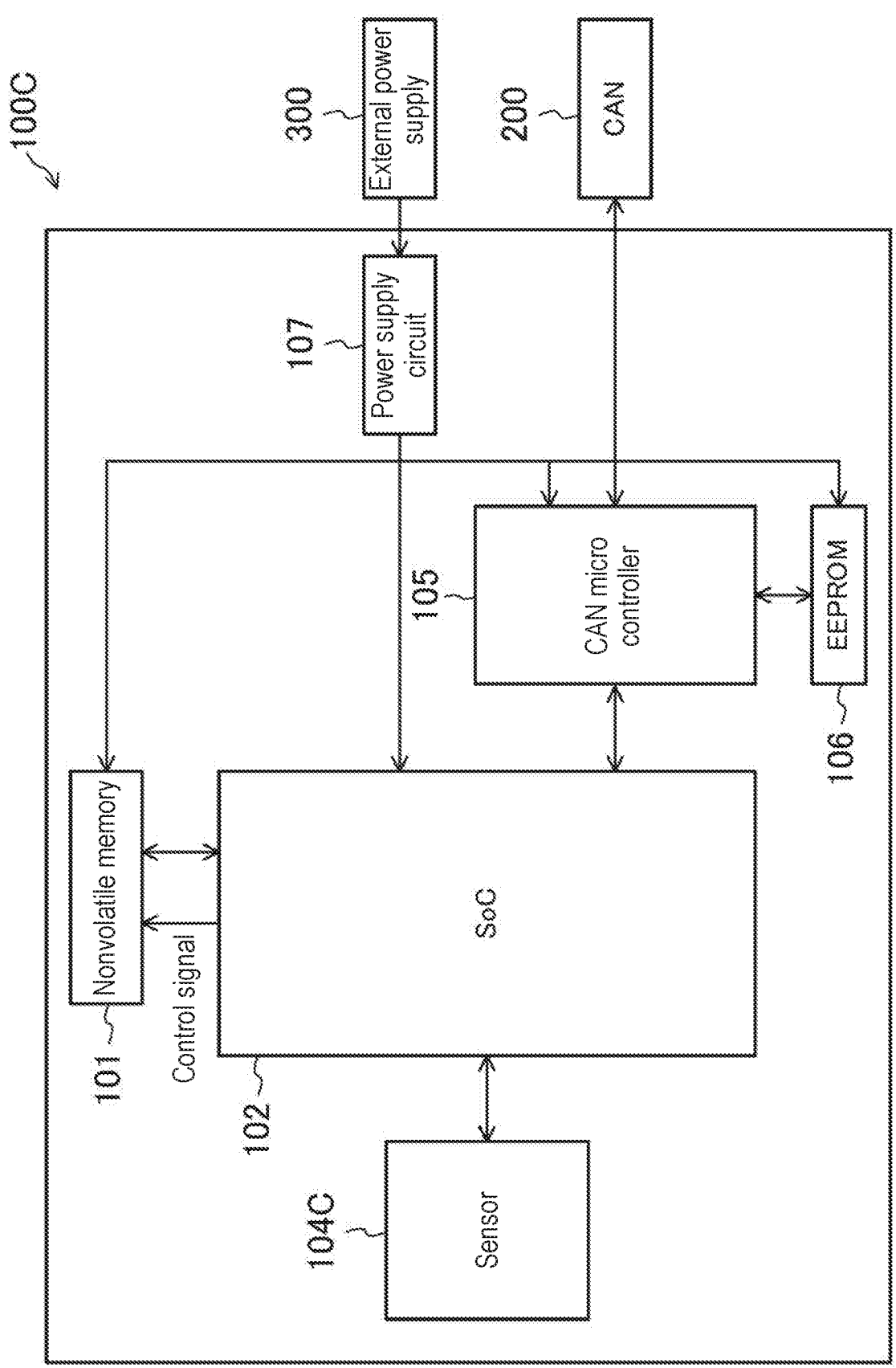
FIG. 15 is a block diagram illustrating an in-vehicle detection system according to a second modification.

FIG. 15 is a block diagram illustrating an in-vehicle detection system according to a second modification. In FIG. 15, the same component as in-vehicle detection system 100 in FIG. 1 is designated by the same reference numeral, and the overlapping description will be omitted.

In the first and second examples, temperature detection circuit 103A or rewriting frequency detection circuit 103B is provided as detector 103, and SoC 102 changes the control signal of nonvolatile memory 101 according to the output of temperature detection circuit 103A or rewriting frequency detection circuit 103B.

On the other hand, in in-vehicle detection system 100C of the second modification in FIG. 15, using sensor 104C, such as a camera sensor (imaging sensor), which captures the image of the state outside the vehicle, SoC 102 changes the control signal of nonvolatile memory 101 according to the output of sensor 104C. That is, in the second modification, detector 103 of in-vehicle detection system 100 in FIG. 1 is constructed with sensor 104C.

When sensor 104C is the imaging sensor, for example, the writing time or the writing target memory array of nonvolatile memory 101 may be changed by changing the control signal of nonvolatile memory 101 according to a priority of imaging information.

The second modification can also be applied to the case that sensor 104C is a sensor except for the imaging sensor.

Detector 103 of temperature detection circuit 103A of the first example or rewriting frequency detection circuit 103B of the second example and sensor 104C of the second modification are used at the same time, and SoC 102 may change the control signal of nonvolatile memory 101 according to a combination of the outputs of detector 103 and sensor 104C.

(Third Modification)

FIG. 16 is a block diagram illustrating an in-vehicle detection system according to a third modification. In FIG. 16, the same component as in-vehicle detection system 100 in FIG. 1 is designated by the same reference numeral, and the overlapping description will be omitted.

In in-vehicle detection system 100 of FIG. 1, detector 103 directly outputs the detected information to SoC 102.

On the other hand, in in-vehicle detection system 100D of the third modification in FIG. 16, information detected by detector 103D is output to SoC 102 through controller area network (CAN) 200D and CAN micro controller 105.

In the third modification, SoC 102 may be one of vehicle central processing units (CPUs) connected to CAN 200D.

In the third modification, sensor 104C of the second modification may be provided instead of detector 103D.

The description of the exemplary embodiment (including each example, and each modification, the same shall apply hereinafter) is only illustrative, the exemplary embodiment does not restrict the present disclosure and its application or use, and various changes can be made without departing from the scope of the present disclosure. For example, any combination of the examples and the modifications can be made.

In the exemplary embodiment, the SoC changes the writing time or the writing target memory array of the nonvolatile memory by changing the control signal of the nonvolatile memory. However, a control target of the nonvolatile memory is not limited to the writing time and the writing target memory array.

In the exemplary embodiment, only the nonvolatile memory is provided as the memory used in the SoC. Alternatively, depending on the application of the vehicle, a DRAM or the like that functions as a work area may separately be provided in at least a part of the data stored in the nonvolatile memory. Even in this case, the memory capacity of the DRAM can be decreased as compared with the conventional in-vehicle detection system on which the ROM and DRAM having the same memory capacity are mounted, so that the degree of freedom of mounting the system on the vehicle can be secured. Additionally, the time necessary for the data transfer from nonvolatile memory to the DRAM can be shortened at power on.

In the exemplary embodiment, the sensor is provided. Alternatively, the sensor may not be provided. For example, the in-vehicle detection system may be an ECU (Electronic Control Unit) in which a temperature detection circuit is incorporated as the detector. In this case, the in-vehicle detection system may change the control signal of the nonvolatile memory in accordance with the detected temperature, and output the detected temperature to the external device through the CAN. Consequently, the in-vehicle detection system that outputs the temperature at the ECU is constructed.

INDUSTRIAL APPLICABILITY

The present disclosure is useful for the in-vehicle detection system including the system on chip.

The invention claimed is:

1. An in-vehicle detection system, comprising:
a nonvolatile memory;
a controller; and
a detector that outputs detection information to the controller,
wherein the detector is one of a detection circuit that detects an ambient temperature of the nonvolatile memory or constructed with an image sensor that is mounted on a vehicle,
the controller reads and writes data from and in the nonvolatile memory, and
the controller changes a writing time of a data minimum writing unit of the nonvolatile memory in the in-vehicle detection system by changing a control signal of the nonvolatile memory in accordance with the detection information outputted by the detector, and keeps a clock cycle of the nonvolatile memory constant by setting the clock cycle of the nonvolatile memory to a time longer than a maximum value of the writing time.

2. The in-vehicle detection system according to claim 1, wherein
the nonvolatile memory includes a plurality of memory arrays, and
the controller selects one of the plurality of memory arrays that is a writing target memory array of the nonvolatile memory by changing the control signal of the nonvolatile memory.

3. The in-vehicle detection system according to claim 1, wherein
the detector is the detection circuit that detects the ambient temperature of the nonvolatile memory.

4. The in-vehicle detection system according to claim 1, wherein
the detector is the detection circuit and further detects a rewriting frequency of the nonvolatile memory.

5. The in-vehicle detection system according to claim 3, wherein
the detector is disposed inside or in a vicinity of the nonvolatile memory.

6. The in-vehicle detection system according to claim 1, wherein
the detector is constructed with the imaging sensor that is mounted on the vehicle.

7. The in-vehicle detection system according to claim 1, further comprising
a controller area network (CAN) interposed between the detector and the controller.

8. The in-vehicle detection system according to claim 1, wherein
the nonvolatile memory is a randomly accessible memory.

9. The in-vehicle detection system according to claim 8, wherein
the nonvolatile memory is a resistance read only memory (RAM), a ferroelectric RAM, a magnetic RAM, or a phase change memory.

10. An in-vehicle detection system, comprising:
a nonvolatile memory;
a controller; and
a detector that outputs detection information to the controller,
wherein the detector is one of a detection circuit that detects an ambient temperature of the nonvolatile memory or constructed with an image sensor that is mounted on a vehicle,
the controller reads and writes data from and in the nonvolatile memory, and
the controller changes a writing time of a data minimum writing unit of the nonvolatile memory in the in-vehicle detection system by changing a control signal of the nonvolatile memory in accordance the detection information outputted by the detector, and changes a clock cycle of the nonvolatile memory in accordance with a change in the writing time of the nonvolatile memory.

11. The in-vehicle detection system according to claim 10, wherein
the nonvolatile memory includes a plurality of memory arrays, and
the controller selects one of the plurality of memory arrays that is a writing target memory array of the nonvolatile memory by changing the control signal of the nonvolatile memory.

12. The in-vehicle detection system according to claim 10, wherein
the detector is the detection circuit that detects the ambient temperature of the nonvolatile memory.

13. The in-vehicle detection system according to claim 10, wherein
the detector is the detection circuit and further detects a rewriting frequency of the nonvolatile memory.

14. The in-vehicle detection system according to claim 12, wherein
the detector is disposed inside or in a vicinity of the nonvolatile memory.

15. The in-vehicle detection system according to claim 10, wherein
the is constructed with the imaging sensor that is mounted on the vehicle.

16. The in-vehicle detection system according to claim 10, further comprising
a controller area network (CAN) interposed between the detector and the controller.

17. The in-vehicle detection system according to claim 10 wherein
the nonvolatile memory is a randomly accessible memory.

18. An in-vehicle detection system, comprising:
a nonvolatile memory;
a controller;
a detector that outputs detection information to the controller; and
a controller area network (CAN) interposed between the detector and the controller,
wherein the controller reads and writes data from and in the nonvolatile memory, and
the controller changes a writing time of a data minimum writing unit of the nonvolatile memory in the in-vehicle detection system by changing a control signal of the nonvolatile memory in accordance with the detection information outputted by the detector, and keeps a clock cycle of the nonvolatile memory constant by setting the clock cycle of the nonvolatile memory to a time longer than a maximum value of the writing time.

* * * * *